(12) United States Patent
Freidhoff

(10) Patent No.: US 7,045,459 B2
(45) Date of Patent: May 16, 2006

(54) THIN FILM ENCAPSULATION OF MEMS DEVICES

(75) Inventor: Carl B. Freidhoff, New Freedom, PA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/076,559

(22) Filed: Feb. 19, 2002

(65) Prior Publication Data

US 2003/0155643 A1    Aug. 21, 2003

(51) Int. Cl.
*H01L 21/44*    (2006.01)

(52) U.S. Cl. .................... 438/666; 257/678; 257/679; 257/680

(58) Field of Classification Search ............... 438/48, 438/50, 51, 52, 53, 666, 748; 257/414, 417, 257/678–680
See application file for complete search history.

(56) References Cited

U.S. PATENT DOCUMENTS

| | | | |
|---|---|---|---|
| 5,504,026 A | | 4/1996 | Kung |
| 5,619,061 A | | 4/1997 | Goldsmith et al. |
| 5,723,171 A | * | 3/1998 | Cuchiaro et al. ............. 427/96 |
| 5,798,283 A | * | 8/1998 | Montague et al. ............ 438/24 |
| 5,963,788 A | | 10/1999 | Barron et al. |
| 6,146,917 A | | 11/2000 | Zhang et al. |
| 6,149,828 A | | 11/2000 | Vaartstra |
| 6,174,820 B1 | * | 1/2001 | Habermehl et al. .......... 438/745 |
| 6,307,169 B1 | | 10/2001 | Sun et al. |
| 6,534,413 B1 | * | 3/2003 | Robertson et al. .......... 438/706 |
| 2002/0019079 A1 | | 2/2002 | Kawai |
| 2002/0096421 A1 | * | 7/2002 | Cohn et al. .................. 200/181 |
| 2002/0181725 A1 | * | 12/2002 | Johannsen et al. .......... 381/174 |
| 2003/0001251 A1 | * | 1/2003 | Cheever et al. ............. 257/685 |
| 2003/0025984 A1 | * | 2/2003 | Gudeman et al. ........... 359/291 |
| 2003/0143775 A1 | * | 7/2003 | Brady ........................ 438/106 |

FOREIGN PATENT DOCUMENTS

DE    199 61 578 A1    6/2001

OTHER PUBLICATIONS

European Communication.

* cited by examiner

*Primary Examiner*—Hoai Pham
*Assistant Examiner*—Nathan W. Ha
(74) *Attorney, Agent, or Firm*—Rothwell, Figg, Ernst & Manbeck

(57) ABSTRACT

A method of manufacturing a miniature electromechanical system (MEMS) device includes the steps of forming a moving member on a first substrate such that a first sacrificial layer is disposed between the moving member and the substrate, encapsulating the moving member, including the first sacrificial layer, with a second sacrificial layer, coating the encapsulating second sacrificial layer with a first film formed of a material that establishes an hermetic seal with the substrate, and removing the first and second sacrificial layers.

25 Claims, 2 Drawing Sheets

THIN FILM ENCAPSULATION OF MEMS DEVICES

BACKGROUND OF THE INVENTION

1. Field of the Invention

The present invention relates generally to micro-electromechanical systems (MEMS) and, in particular, to a method of encapsulating one or more MEMS devices formed on a substrate.

2. Discussion of the Background Art

Switching devices are used in electronic applications to connect and disconnect electrical signal paths. In radio frequency (RF) and microwave applications, it is desirable to form switches using micro-electromechanical system (MEMS) technology because such switches exhibit low insertion loss and high isolation capability compared to transistor switches especially at frequencies in the GHZ and above. A typical MEMS switch, such as described in U.S. Pat. No. 5,619,061 to Goldsmith et al., includes an electrode in the form of a horizontal beam element with at least one end clamped, hinged or anchored to a post, spacer, via or other type of stationary vertical structure. Another electrode is disposed in opposed relation to the beam element so that, when an appropriate voltage is applied between the two electrodes, the beam element flexes in the direction of the opposed electrode, thereby closing the circuit. When the voltage is removed, the natural resiliency of the beam element returns it to its normally horizontal, open state.

A disadvantage of MEMS devices in general is their sensitivity to environmental conditions. More specifically, since MEMS devices operate through the mechanical movement of a moving member, the gap between the moving member and the opposed electrode must be clear of any particulate matter that may inhibit movement of the member. The components of a MEMS device must also be free of stiction-causing films that can develop when the device is exposed to certain environments. Stiction is an adhesive or electrostatic attraction between electrodes that can have a negative impact on the switching speed and response of the device. When the voltage potential is removed, the electrodes should separate instantaneously. Any residual, unwanted attraction between electrodes will increase the time for separation, thereby decreasing switching speed. In extreme cases, stiction may bind a MEMS switch in the closed position, thus rendering it inoperable.

One way to avoid environmental effects is to incorporate a MEMS device with other components as part of a system and to enclose the entire system in a hermetically sealed package. A disadvantage of this approach is that it dramatically increases the size and cost of the system and, in addition, tends to limit the position of the MEMS device to an exposed surface of the system. The increase in size also necessitates long vias to connect the MEMS device with radiators and other components leading to RF losses and increased noise, particularly at high frequencies (i.e., at or above 10 GHz).

Another way to avoid environmental effects is to individually enclose one or more MEMS devices in a hermetically sealed package prior to incorporating the devices into a system with other components. Ceramic packages with metal seals have been proposed for this purpose. A problem with this approach is that the mating process requires significant handling of the MEMS devices in an unprotected condition. If a number of MEMS devices are formed in a batch on a single wafer, it is also necessary to saw the wafer with the MEMS devices in an unprotected condition thereby increasing the risk of damage to the devices. It is also difficult to achieve and maintain a hermetic seal because of the variety of materials used.

Yet another approach is to form a number of MEMS devices on a first wafer and an equal number of cavities in a second wafer and to use wafer-bonding technology to join the wafers together such that the MEMS devices are each disposed within a cavity in the opposed wafer. A disadvantage of this approach is that it requires precise alignment of the wafers when bonding and complicates subsequent sawing operations. This approach also leads to a significant increase in the overall size of each MEMS device because of the need to use a relatively thick wafer for creation of the cavities.

Therefore, a need exists for an hermetically sealed MEMS device that is small, inexpensive, easy to produce, and reliable.

SUMMARY OF THE INVENTION

A first aspect of the present invention is generally characterized in a method of manufacturing a micro-electromechanical device comprising the steps of forming a moving member on a first substrate such that a first sacrificial layer is disposed between the moving member and the substrate, encapsulating the moving member, including the first sacrificial layer, with a second sacrificial layer, coating the encapsulating second sacrificial layer with a first film formed of a material that establishes an hermetic seal with the substrate, and removing the first and second sacrificial layers. In a preferred embodiment, an opening is formed in the first film to facilitate removal of the sacrificial layers, and the opening is sealed after the sacrificial layers have been removed. In one embodiment, a conductive layer is formed on the first film and connected to a circuit to act as a counter electrode.

A second aspect of the present invention is generally characterized in a micro-electromechanical system (MEMS) device comprising a first substrate, a first control circuit formed on the first substrate and including a first actuation element, a movable member formed on the first substrate in spaced relation to the first actuation element, the movable member being electrically conductive and movable in the direction of the first actuation element, and a helmet defining a hermetically sealed chamber around the movable member, the helmet being formed by removing a sacrificial layer between the movable member and the helmet. In a preferred embodiment, the helmet has tapered side walls and is formed of a silicon oxynitride film.

A third aspect of the present invention is generally characterized in a method of fabricating a micro-electromechanical system (MEMS) device comprising the steps of forming a control circuit with an actuating element on a substrate, defining a movable member above the actuating element by applying a first sacrificial layer over the actuating element, depositing a conductive material such that the material extends from the circuit to cover the first sacrificial layer, and removing portions of the sacrificial layer around the movable member but not between the moving member and the substrate, encapsulating the moving member on all sides with a second sacrificial layer, coating the second sacrificial layer with a material that forms an hermetic seal with the substrate, and removing the first and second sacrificial layers.

Some of the advantages of the MEMS devices according to the present invention are that they are sealed against particulate and vapor contamination while still in the controlled environment of a clean room, they can be sawed, handled and integrated into electronic systems using standard IC techniques without being contaminated or otherwise damaged, they do not need to be positioned on a top surface to be vertically integrated, and they can significantly reduce the size and cost of electronic systems employing MEMS devices by eliminating the need to hermetically seal the entire system.

The above and other features and advantages of the present invention will be further understood from the following description of the preferred embodiments thereof, taken in conjunction with the accompanying drawings wherein like numerals are used to denote like parts.

BRIEF DESCRIPTION OF THE DRAWINGS

The invention will now be described with reference to the following figures, in which.

DETAILED DESCRIPTION OF PREFERRED EMBODIMENTS

A method of manufacturing a MEMS device according to a first embodiment of the present invention is illustrated in FIGS. 1–9. The method can be used to manufacture a variety of MEMS devices but is particularly advantageous when used to manufacture a two electrode switch for radio frequency (RF) applications as shown and described herein.

Figure 1:
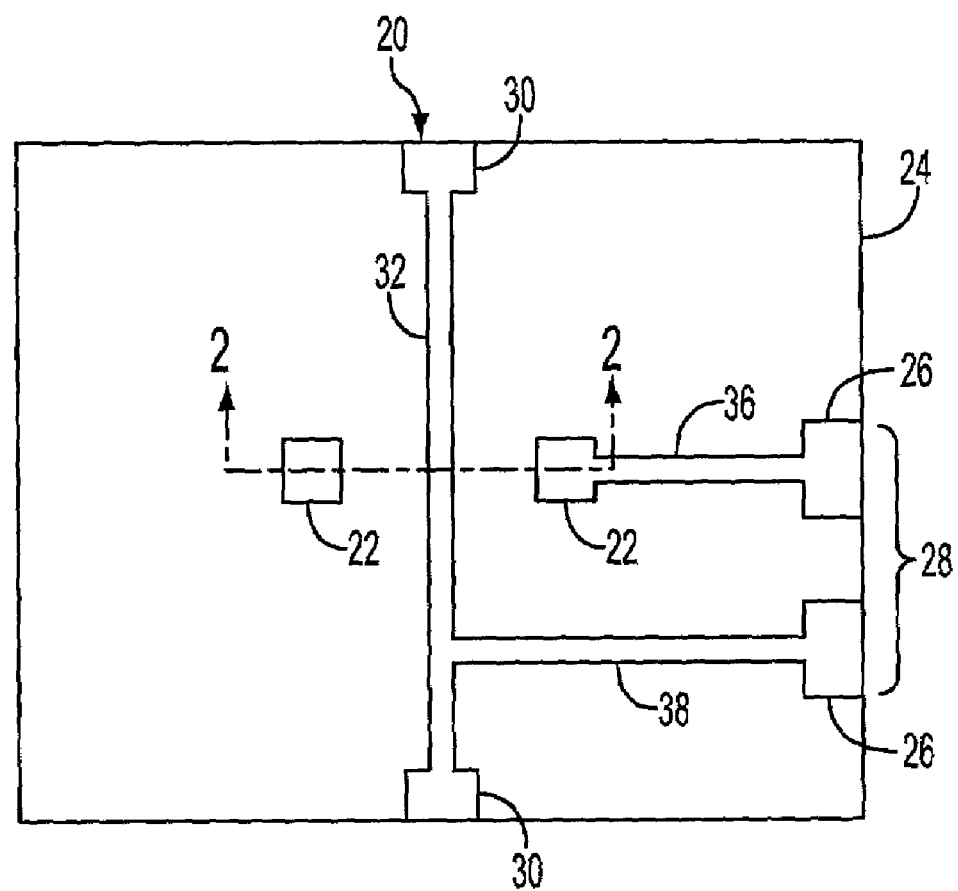
FIG. 1 is a plan view and FIGS. 2–9 are cross-sectional views illustrating a method of fabricating a micro-electromechanical system (MEMS) device in accordance with a first embodiment of the present invention.
Figure 2:
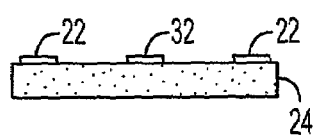

In the first step, illustrated in FIGS. 1 and 2, a first signal network 20 and anchor pads 22 for a movable member are formed on a substrate 24. Bond pads 26 for a control circuit 28 can also be formed on the substrate 24 in this step. The first signal network 20 shown in FIG. 1 includes a pair of bond pads 30 located at opposite edges of the substrate 24 and a stripline 32, which also acts as an actuating element, which is described in detail below extending between the bond pads 30 to function as a first electrode. The first signal network 20 and pads 22 can be formed on the substrate 24 in any conventional manner but are preferably formed using a lift-off procedure wherein a conductive base layer is formed on the substrate and etched through a template defined by a layer of photoresist that is later removed. The substrate 24 can be any suitable material including, but not limited to, a semiconductor material, such as silicon or gallium arsenide, a ceramic, a glass-reinforced plastic, or a plastic material. The conductive base layer material can be any conductive material but is preferably a metal such as copper, platinum, gold, aluminum or alloys thereof.

Figure 3:
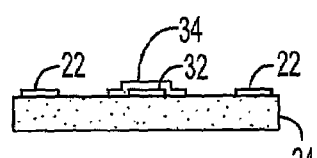

In the second step, illustrated in FIG. 3, a dielectric layer 34 is defined over at least a portion of the stripline 32. In the example shown, the dielectric layer 34 is formed over the entire stripline 32. The dielectric layer 34 functions as an electrically insulative barrier between the stripline 32 and the moving member (not shown) to prevent metal to metal contact that would result in DC shorting as described in greater detail below. The dielectric layer 34 can be formed of any suitable dielectric material but is preferably silicon dioxide or silicon nitride. The dielectric layer 34 is preferably applied using plasma enhanced chemical vapor deposition (PECVD) but can be applied in any conventional manner. It should be noted that the dielectric layer-defining step is optional when manufacturing a three electrode design (not shown) wherein the control circuit acts through a third electrode that is offset from the stripline as opposed to acting through the stripline itself.

Figure 4:
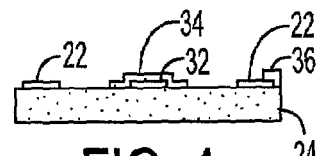

In the third step, illustrated in FIG. 4, the control circuit 28 is defined on the substrate if it has not already been formed in the first step. In the example shown in FIGS. 1 and 4, the control circuit includes first and second conductive paths 36 and 38. The first conductive path 36 extends from a control bond pad 26 to one of the anchor pads 22, and the second conductive path 38 extends from the stripline 32 to the other control pad 26 which goes to ground. The control circuit 28 is configured to present as an open circuit to RF signals while carrying a DC voltage potential. To this end, the conductive paths 36 and 38 of the control circuit are preferably made of a conductive material with high sheet resistance or inductance, such as silicon chrome monoxide or polysilicon, that causes the control circuit to look like an open circuit to RF signals. The conductive paths 36 and 38 can be formed in any conventional manner but are preferably formed by a process known as physical vapor deposition (PVD) (i.e., sputtering).

Figure 5:
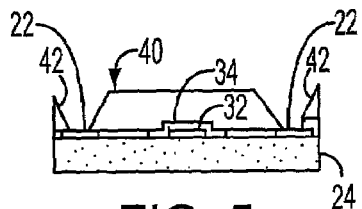

In the fourth step, illustrated in FIG. 5, a first sacrificial layer 40 is applied over the product of the third step to function as a mold upon which a moving member can be formed. In the example shown, the first sacrificial layer 40 has a pair of tapered openings 42 exposing the anchor pads. The thickness of the first sacrificial layer 40 defines the gap between the moving member and the signal line. The taper of the openings 42 defines the geometry of the posts that support the moving member. The sacrificial layer can be photoresist, SiO2, amorphous silicon, germanium or any other material that can be removed in a later step without damaging the other layers. The preferred technique for forming a sacrificial layer 40 with tapered openings 42 is to spin photoresist onto the product of the third step to obtain a substantially uniform layer of photoresist on the substrate, to develop the photoresist using an appropriate mask that creates openings over the anchor pads, and to bake the developed photoresist so that the walls of the openings contract differentially through the thickness of the photoresist to create the desired taper. In an exemplary embodiment, the developed photoresist is baked at 120–180° C. for up to about 30 minutes depending upon the type of photoresist. Another alternative is to form the tapered openings using gray scale photolithography.

Figure 6:
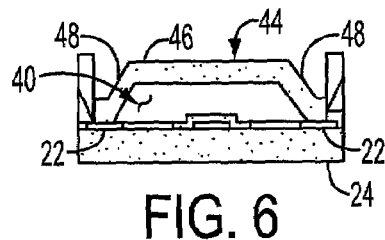

In the fifth step, illustrated in FIG. 6, the moving member 44 is formed using a conductive material such as gold, platinum, copper or aluminum, or a semi-conductor material such as polysilicon or single crystal silicon. One technique for forming the moving member 44 is by a lift-off procedure wherein a layer of the conductive material is formed on the first sacrificial layer 40 and etched through a template defined by a layer of photoresist that is formed on the sacrificial layer and later removed. In the example shown, the procedure results in a moving member 44 having a beam element 46 supported at opposite ends by a pair of posts 48 that extend upwardly from the anchor pads 22 at an angle towards one another.

Figure 7:
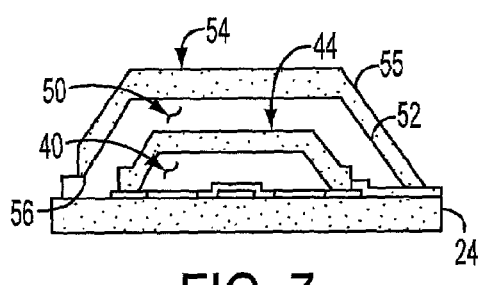

In the sixth step, illustrated in FIG. 7, a second sacrificial layer 50 is defined over the moving member 44. The preferred technique for forming the second sacrificial layer 50 is to apply photoresist over the product of the fifth step, to develop the photoresist, and to bake the developed photoresist so that the sacrificial layer contracts differentially through the thickness of the photoresist to create tapered sides 52 that reduce the overall size and volume of the device. The resulting layer 50 extends over the top and around the sides of the moving member 44 to serve as a mandrel upon which a helmet can be formed in spaced relation to the moving member.

Referring still to FIG. 7, a helmet or cover 54 is formed by depositing a first encapsulant layer 55 over the second sacrificial layer 50. The helmet 54 defines a hermetically sealed chamber containing the moving member 44. The helmet 54 can be made of any encapsulant material capable of forming an hermetic seal with the substrate 24 and the various circuit components but is preferably a low temperature, low stress PECVD film such as silicon oxynitride. The preferred deposition temperature for this process is less than 150° C. depending upon the photoresist processing method. The gases used in the PECVD deposition of silicon oxynitride are preferably silane, nitrous oxide, ammonia and a carrier of nitrogen or argon. The silane, nitrous oxide and ammonia are reactive gases that decompose during the deposition leaving nitrogen gas inside the helmet 54 at a reduced pressure. The pressure differential between the nitrogen gas inside the helmet 54 and the atmosphere places the helmet into compression which is a desirable condition for the encapsulant material.

At some point during or after deposition of the encapsulant, one or more openings 56 are formed in the first helmet layer 55 as shown in FIG. 7. The openings 56 can be formed during the encapsulation by masking the areas where openings are desired. After encapsulation, openings can be formed by masking the helmet and etching through the helmet material with an appropriate etchant, for example, by reactive ion etching using etchants such as a chlorofluorocarbon or $SF_6$ gas or etching with a hydrofluoric acid based wet etch solution. The size, shape, number and location of the openings 56 are chosen to facilitate introduction of a material into the helmet 54 for removal of the sacrificial layers 40 and 50 and to allow subsequent sealing of the helmet. For example, a single rectangular opening about half the height of the moving member can be formed on one side of the helmet as shown in FIG. 7. Preferably, a pair of rectangular openings are formed on opposite sides of the helmet.

Figure 8:
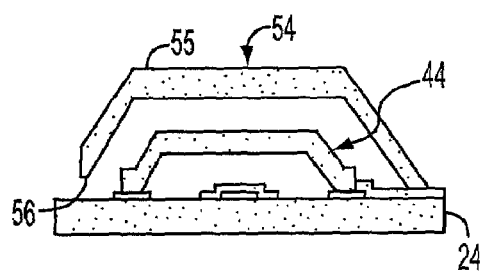

In the seventh step, illustrated in FIG. 8, the first and second sacrificial layers 40 and 50 are removed via the opening 56 in the helmet 54. The preferred technique for removing the sacrificial layers 40 and 50 is to immerse the product of the sixth step in a material that reacts with the sacrificial layers but not with the helmet material. For example, if the sacrificial layers are formed of photoresist, the product can be immersed in standard photoresist stripper. If, on the other hand, the sacrificial layers are formed of amorphous silicon, a material such as xenon difluoride may be used. Other alternatives include placing the product in a vacuum chamber to remove air and introducing a reactive gas, or immersing the product in a supercritical fluid, such as liquid $CO_2$. It should also be noted that use of a transparent helmet material, such as silicon oxynitride, permits visual observation of the progress of the removal process so that complete removal of the sacrificial layers can be confirmed.

Once the sacrificial layers have been removed, the elements inside the helmet 54 can optionally be treated with an anti-stiction coating, such as a self-assembled monolayer, to make the surfaces of the elements hydrophobic and to increase the life of the device.

Figure 9:
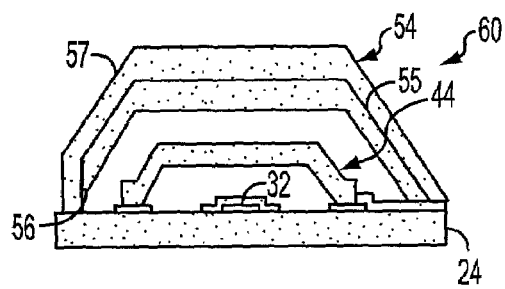

In the eighth step, illustrated in FIG. 9, the openings 56 formed in the helmet 54 are sealed. A preferred technique for sealing the helmet openings is to deposit a second encapsulant layer 57 over the first encapsulant layer 55 such that the second encapsulant layer extends over the openings and forms a seal with the first layer and the substrate 24. The second encapsulant layer 57 can be made of any material capable of sealing openings in the first encapsulant layer 55 but is preferably made of the same material as the first encapsulant layer and formed in the same manner as the first encapsulant layer. Using the same material for the first and second encapsulant layers ensures that both layers have the same coefficient of thermal expansion such that interlaminar stresses that could lead to cracking and leaks are minimized.

If bond pads have been formed on the substrate, the next step is to remove the helmet material covering the bond pads as a result of earlier steps so that electrical connections can be made to the resulting MEMS device 60.

The resulting MEMS device 60 includes an electrically conductive moving member 44 supported above a signal line 32 on a substrate 24 within a hermetically sealed chamber defined by a helmet 54. Electrical connections between the moving member 44, the signal line 32 and external circuits (not shown) can be made using the bond pads 30 illustrated in FIG. 1. In general, the control circuit 28 is used to control the position of the moving member relative to the signal line 32 actuating element by varying the voltage potential between these elements. The signal line 32 is connected to circuitry that carries a signal affected by the position of the moving member 44. Because the MEMS device 60 exhibits extremely low loss, it is ideal for use in RF applications as a switch or a tunable capacitor. The device 60 can also be used in a phase shifter, a time delay unit, and other devices and systems.

MEMS devices produced in accordance with the present invention can be significantly thinner than those produced using standard wafer bonding techniques. In an exemplary embodiment, the overall height of a MEMS device according to the present invention is about 12 μm from the surface of the substrate to the top of the helmet, with the base metal having a thickness of about 0.5 μm, the dielectric layer having a thickness of about 0.5 μm, an air gap of about 2 μm between the dielectric and the moving member, the moving member having a thickness of about 2 μm, an air gap of about 2 μm between the moving member and the helmet, and the helmet having a thickness of about 5 μm.

Figure 10:
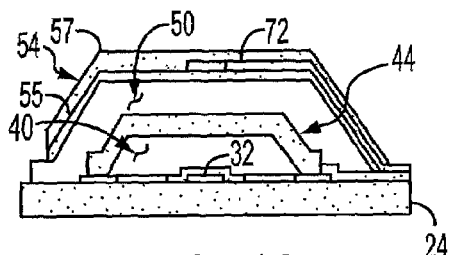
FIGS. 10–12 are cross-sectional views illustrating a method of fabricating an micro-electromechanical system device in accordance with a second embodiment of the present invention.
Figure 11:
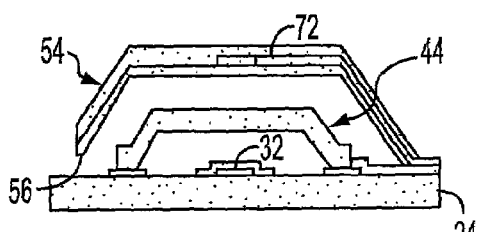
Figure 12:
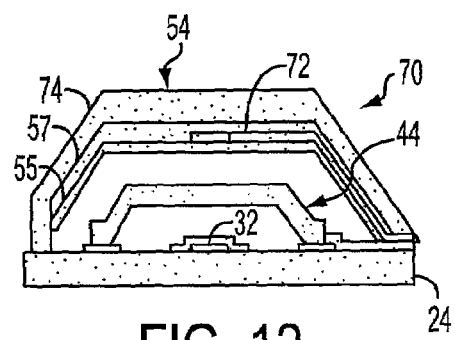

Another method of manufacturing a MEMS device according to a second embodiment of the present invention involves performing the steps illustrated in FIGS. 10–12 after the steps illustrated in FIGS. 1–7. The resulting MEMS device 70 includes a counter electrode 72 embedded in the helmet 54 in addition to an electrode 32 on the substrate 24 such that the moving member 44 is disposed between a pair of electrodes.

The first through sixth steps of the second embodiment are performed in the same manner as described above to provide an intermediate product with a first encapsulant layer 55 disposed over and around the moving member 44 and the sacrificial layers 40 and 50.

In the seventh step of the second embodiment, illustrated in FIG. 10, a counter electrode 72 is defined on the first encapsulant layer 55, and an optional second encapsulant layer 57 is defined on the first encapsulant layer thereby covering the counter electrode. The counter electrode 72 can be formed of any electrically conductive material in any suitable manner but is preferably formed of the same material as the signal line 32 using a lift-off technique or by coating the encapsulant layer 55 with a conductive layer and etching the counter electrode. The second encapsulant layer 57 can be made of any material to cover the counter electrode 72 but is preferably formed of the same material as the first encapsulant layer 55 using the same application technique. The second encapsulant layer 57 is desirable to protect the counter electrode 72 during subsequent process steps but is optional. The third encapsulant layer 74 described below can be used to cover the counter electrode 72 if a second encapsulant layer is not applied.

In the eighth step of the second embodiment, illustrated in FIG. 11, the sacrificial layers 40 and 50 are removed from within the helmet 54 via an opening 56 in the same manner as described above, for example, by immersing the MEMS structure in photoresist stripper.

In the ninth step of the second embodiment, illustrated in FIG. 12, a third encapsulant layer 74 is deposited to seal gaps in the first and second layers 55 and 57 of encapsulant. The third encapsulant layer 74 can be formed of any material capable of sealing the gaps but is preferably formed of the same material as the first and second encapsulant layers 55 and 57 and in the same manner. At this point, the bond pads 26 and 30 are etched open as before.

The resulting MEMS device 70 has an electrically conductive moving member 44 disposed within a hermetically sealed chamber defined by a helmet 54 on a substrate 24, the moving member being supported between a primary electrode defined by a signal line 32 on the substrate and a counter electrode 72 mounted on the helmet. Electrical connections between the moving member 44, the signal line 32 and external circuits (not shown) can be made using the bond pads 30 illustrated in FIG. 1. One or more additional bond pads can be formed in the same manner for the counter electrode 72. The signal line 32 and first control circuit 28 are connected as described previously. The counter electrode 72 can be electrically connected to a second control circuit and/or a second signal circuit depending upon the desired application. By forming electrodes on opposite sides of the moving member 44, the moving member can be made to move up or down from its rest position. Thus, the presence of a counter electrode 72 on a side of the moving member 44 opposite the signal line 32 increases the effective range of movement of the moving member and, thus, the frequency range of operation of the device 70 without increasing the gap between the moving member and the substrate 24 or the actuation voltage. The counter electrode 72 also allows the gap between the moving member 44 and signal lines 32 to be precisely defined in a repeatable manner even when the moving member suffers from effects such as creep, plastic deformation, and fatigue. The design also provides a dielectric layer (i.e., the first encapsulant layer 55) to prevent a DC short when the moving member approaches the counter electrode.

The method according to either embodiment of the invention can be performed to produce multiple MEMS devices of the above type on a single substrate. The MEMS devices can all be enclosed within a single helmet, or divided between multiple helmets. If the MEMS devices are disposed within multiple helmets on a single substrate, it is possible to cut and dice the substrate between helmets so as to separate the devices without fear of contamination since the moving members are contained within individually sealed helmets that protect internal elements from outside conditions. MEMS devices fabricated according to the above method can be handled with conventional pick and place machinery without the need for modification such that, for example, the devices can be wire bonded, connected using flip chip technology, or ceramic bonded to a circuit as desired without fear of contamination. Because the moving member is protected, the MEMS device need not be formed on the top surface of an assembly, allowing close vertical integration of the MEMS device with other components and devices.

While the invention has been described in detail above, it will be appreciated that various modifications can be made without departing from the scope of the invention as defined in the following claims. For example, the moving member can be a simply supported double-clamped beam fixed at both ends as shown, a cantilever beam member fixed at one end, a diaphragm (edge-supported) member, or any other type of movable member. The moving member can be actuated by electrostatic forces generated by creating a DC voltage potential between the moving member and a control electrode, by piezoelectric, magnetic or thermal elements mounted on the moving member and powered by a control circuit, or by external physical stimuli such as acceleration. The signal and control networks can be defined on the same side of the substrate as the moving member as shown, or portions of the networks can be defined on an opposite side of the substrate using vias through the substrate to connect with portions on the same side as the moving member. The helmet can have any shape including, but not limited to, a tapered shape as shown, a rounded dome shape, or a generally rectangular, box-like shape. The signal network can include a stripline as shown or segments separated by a gap that is closed by movement of the moving member.

What is claimed is:

1. A method of manufacturing a micro-electromechanical device comprising the steps of:
    forming a moving member on a first substrate such that a first sacrificial layer is disposed between the moving member and the substrate;
    encapsulating the moving member, including the first sacrificial layer, with a second sacrificial layer;
    coating the second sacrificial layer with a first film formed of a material that establishes an hermetic seal with the substrate, said first film having tapered sides; and
    removing the first and second sacrificial layers.

2. The method of claim 1, further comprising the step of forming an opening in the first film prior to removing the first and second sacrificial layers.

3. The method of claim 2, wherein said opening forming step is performed during said coating step.

4. The method of claim 2, wherein said opening forming step is performed after said coating step.

5. The method of claim 2, further comprising the step of sealing the opening after the first and second sacrificial layers are removed.

6. The method of claim 5, wherein said sealing step is performed by coating the first film with a second film formed of the same material as the first film.

7. The method of claim 2, wherein said step of removing the first and second sacrificial layers includes the step of immersing the switch in one of a reactive liquid solution, a reactive gas, and a supercritical fluid.

8. The method of claim 1, further comprising the step of forming a conductive layer on the first film.

9. The method of claim 8, further comprising the step of coating the conductive layer with a second film such that the conductive layer is disposed between the first and second films.

10. The method of claim 9, wherein the second film comprises the same material as the first film.

11. The method of claim 8, further comprising the step of connecting the conductive layer with a second circuit that causes the conductive layer to act as a counter electrode.

12. The method of claim 1, wherein the micro-electromechanical device is formed on a substrate with other circuit components and the first film covers only the electromechanical device.

13. The method of claim 1, further comprising the step of mounting the first substrate on a second substrate carrying other circuit components.

14. The method of claim 5, further comprising the step of coating the moving member with an anti-stiction film prior to said sealing step.

15. The method of claim 1, wherein said steps are performed for a plurality of moving members to form a plurality of microelectromechanical devices on the first substrate encapsulated by the first film, and further comprising the step of cutting the substrate to separate the microelectromechanical devices.

16. A micro-electromechanical system (MEMS) device comprising:
- a first substrate;
- a first control circuit formed on said first substrate and including a first actuation element;
- a movable member formed on said first substrate in spaced relation to said first actuation element, said movable member being electrically conductive and movable in the direction of said first actuation element; and
- a helmet defining a hermetically sealed chamber around said movable member, said helmet being formed by removing a sacrificial layer between said movable member and said helmet, wherein said helmet has tapered sides.

17. The MEMS device of claim 16, and further comprising an inert gas disposed within said hermetically sealed chamber.

18. The MEMS device of claim 16, and further comprising a second control circuit with an actuator element disposed within said helmet.

19. The MEMS device of claim 16, and further comprising a plurality of moving members formed on said substrate, wherein said helmet defines a plurality of hermetically sealed chambers around said movable members.

20. The MEMS device of claim 16, wherein said helmet is formed of a silicon oxynitride film.

21. A method of fabricating a micro-electromechanical system (MEMS) device comprising the steps of:
- forming a control circuit with an actuating element on a substrate;
- forming a moving member above the actuating element by applying a first sacrificial layer over the actuating element, depositing a conductive material such that the material extends from the control circuit to cover the first sacrificial layer, and removing portions of the sacrificial layer around the movable member but not between the moving member and the substrate;
- encapsulating the moving member on all sides with a second sacrificial layer;
- coating the second sacrificial layer with a material that forms a hermetic seal with the substrate having tapered sides; and
- removing the first and second sacrificial layers.

22. The method of claim 21, wherein said step of applying a first sacrificial layer includes tapering edges of the first sacrificial layer.

23. The method of claim 22, wherein said step of encapsulating the moving members with a second sacrificial layer includes tapering edges of the second sacrificial layer.

24. The method of claim 23, further comprising a step of curing then baking the first and second sacrificial layers after.

25. A method of manufacturing a micro-electromechanical device comprising the steps of:
- forming a moving member on a first substrate such that a first sacrificial layer is disposed between the moving member and the substrate;
- encapsulating the moving member, including the first sacrificial layer, with a second sacrificial layer;
- coating the second sacrificial layer with a first film formed of a material that establishes an hermetic seal with the substrate, said first film having tapered sides; and
- removing the first and second sacrificial layers.

* * * * *